United States Patent
Shih et al.

(10) Patent No.: US 11,818,865 B2
(45) Date of Patent: Nov. 14, 2023

(54) EXPANSION CARD ASSEMBLY AND LIQUID-COOLING DEVICE

(71) Applicant: COOLER MASTER CO., LTD., New Taipei (TW)

(72) Inventors: Shun-Yu Shih, New Taipei (TW); Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 189 days.

(21) Appl. No.: 17/475,047

(22) Filed: Sep. 14, 2021

(65) Prior Publication Data
US 2022/0087063 A1    Mar. 17, 2022

(30) Foreign Application Priority Data
Sep. 16, 2020  (TW) .................................. 109131877

(51) Int. Cl.
*H05K 7/20*  (2006.01)
*G06F 1/20*  (2006.01)

(52) U.S. Cl.
CPC ........... *H05K 7/20263* (2013.01); *G06F 1/20* (2013.01); *H05K 7/20272* (2013.01); *G06F 2200/201* (2013.01)

(58) Field of Classification Search
CPC . H05K 7/20263; G06F 2200/201; F28D 7/16; F28D 1/05383
See application file for complete search history.

(56) References Cited

U.S. PATENT DOCUMENTS

| | | | | |
|---|---|---|---|---|
| 5,415,223 | A * | 5/1995 | Reavis | F25B 39/028 165/96 |
| 9,986,632 | B2* | 5/2018 | Shih | H05K 1/0203 |
| 2008/0179044 | A1* | 7/2008 | Hu | H01L 23/473 257/E23.098 |
| 2008/0271880 | A1* | 11/2008 | Steinbauer | F28D 7/024 165/163 |
| 2014/0262181 | A1* | 9/2014 | Taras | F28D 1/05391 29/890.047 |
| 2016/0227672 | A1* | 8/2016 | Lin | H05K 7/20254 |
| 2017/0198954 | A1* | 7/2017 | Kim | F28F 1/128 |
| 2019/0249939 | A1* | 8/2019 | Otsuki | H01L 23/473 |

* cited by examiner

*Primary Examiner* — Lionel Nouketcha
(74) *Attorney, Agent, or Firm* — Maschoff Brennan

(57) ABSTRACT

This disclosure relates to a liquid-cooling device that includes a liquid block and a radiator. The liquid block is in thermal contact with an interface card. The radiator includes a first tank, a second tank, and a heat dissipation channel structure. The first tank and the second tank respectively have a first chamber and a second chamber. The heat dissipation channel structure includes a plurality of liquid transmission components. The first chamber and the second chamber are respectively connected to two opposite sides of the heat dissipation channel structure. Each of the liquid transmission components has an end in fluid communication with the first chamber of the first tank and another end in fluid communication with the second chamber of the second tank. The first chamber and the second chamber are in fluid communication with the liquid block to form a cooling cycle.

16 Claims, 4 Drawing Sheets

EXPANSION CARD ASSEMBLY AND LIQUID-COOLING DEVICE

CROSS-REFERENCE TO RELATED APPLICATIONS

This non-provisional application claims priority under 35 U.S.C. § 119(a) on Patent Application No(s). 109131877 filed in Taiwan, R.O.C. on Sep. 16, 2020, the entire contents of which are hereby incorporated by reference.

TECHNICAL FIELD

The present disclosure relates to an expansion card assembly and a liquid-cooling device, more particularly to an expansion card assembly and a liquid-cooling device with a lateral flow for heat dissipation.

BACKGROUND

As technology develops, a computer has become an indispensable necessity in daily life. In order to meet various requirements or to have additional functions of the computer, the motherboard of the computer generally have a plurality of expansion slots for installation of expansion cards such as a graphics card, a sound card, and a network card. However, the working expansion cards may generate heat due to current flowing through the resister in the circuit. If the heat cannot be efficiently dissipated but accumulates on electronic components inside the expansion cards, the electronic components may be easily damaged due to accumulated and increased temperature thereon.

In order to increase heat dissipation efficiency of the expansion cards, a heat dissipation device is typically used to quickly absorb heat generated by the expansion cards. However, the heat dissipation device in the related art still have insufficient heat dissipation efficiency for the expansion cards. Therefore, how to further improve heat dissipation efficiency of the heat dissipation device has become an important issue in this field.

SUMMARY

The present disclosure provides an expansion card assembly and a liquid-cooling device of improved heat dissipation efficiency.

According to one aspect of the present disclosure, an expansion card assembly includes an interface card, a liquid-cooling device, and an airflow generator. The liquid-cooling device includes a liquid block and a radiator. The liquid block is in thermal contact with the interface card. The radiator includes a first tank, a second tank, and a heat dissipation channel structure. The first tank has a first chamber. The second tank has a second chamber. The heat dissipation channel structure includes a plurality of liquid transmission components. The first chamber of the first tank and the second chamber of the second tank are respectively connected to two opposite sides of the heat dissipation channel structure. Each of the plurality of liquid transmission components of the heat dissipation channel structure has an end in fluid communication with the first chamber of the first tank and another end in fluid communication with the second chamber of the second tank. The first chamber and the second chamber are in fluid communication with the liquid block to form a cooling cycle. The airflow generator is located adjacent to the radiator, and the airflow generator is configured to generate an airflow flowing towards the heat dissipation channel structure of the radiator.

According to another aspect of the present disclosure, a liquid-cooling device is configured to be in thermal contact with an interface card, and the liquid-cooling device includes a liquid block and a radiator. The liquid block is configured to be in thermal contact with the interface card. The radiator includes a first tank, a second tank, and a heat dissipation channel structure. The first tank has a first chamber. The second tank has a second chamber. The heat dissipation channel structure includes a plurality of liquid transmission components. The first chamber of the first tank and the second chamber of the second tank are respectively connected to two opposite sides of the heat dissipation channel structure. Each of the plurality of liquid transmission components of the heat dissipation channel structure has an end in fluid communication with the first chamber of the first tank and another end in fluid communication with the second chamber of the second tank. The first chamber and the second chamber are in fluid communication with the liquid block to form a cooling cycle.

According to the expansion card assembly and the liquid-cooling device discussed above, each liquid transmission component of the heat dissipation channel structure has an end in fluid communication with the first chamber of the first tank and another end in fluid communication with the second chamber of the second tank, preventing a mixture of hot and cold liquid from existing in the first chamber and the second chamber. Therefore, the heat dissipation efficiency of the liquid-cooling device can be improved.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
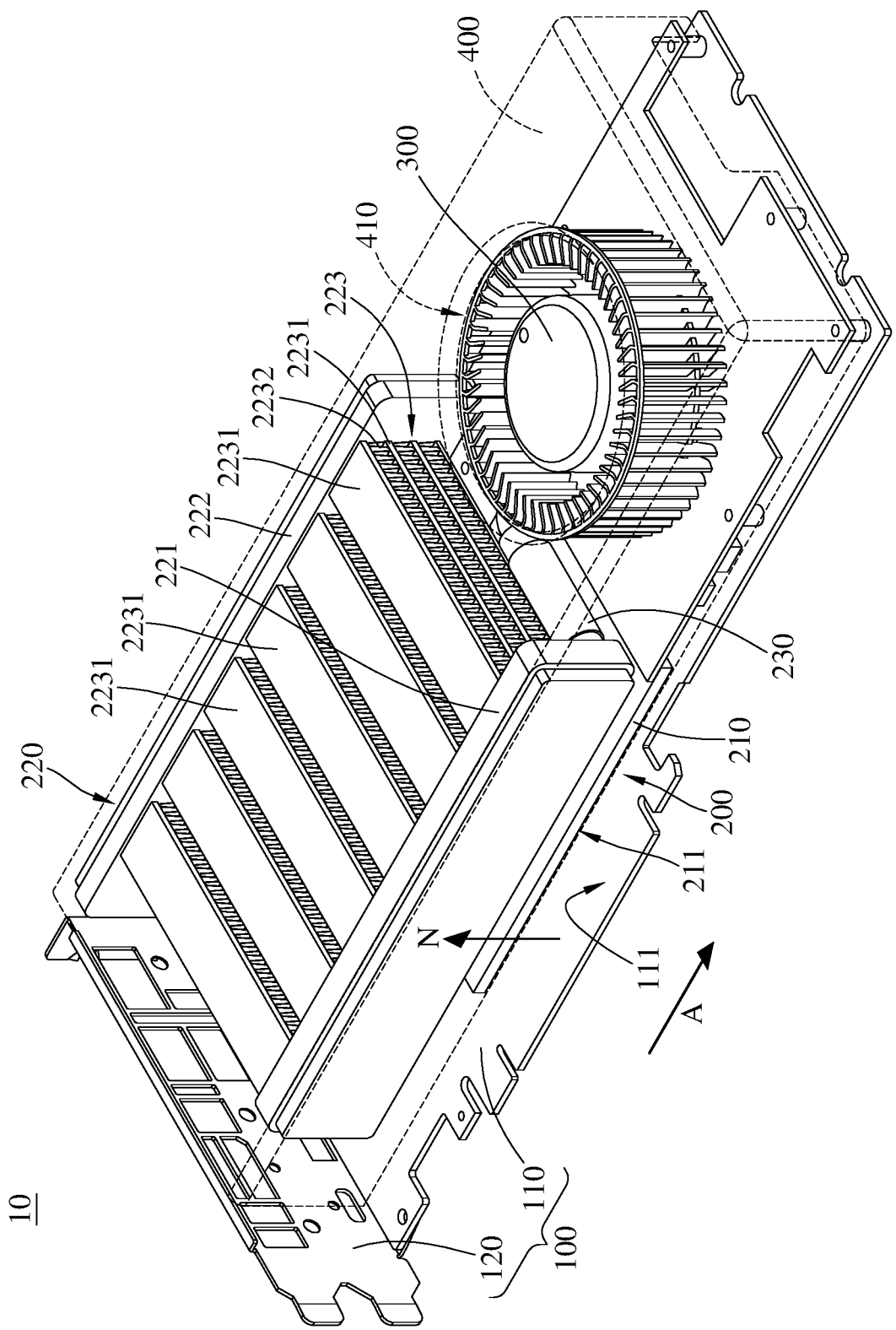
FIG. 1 is a perspective view of an expansion card assembly according to a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
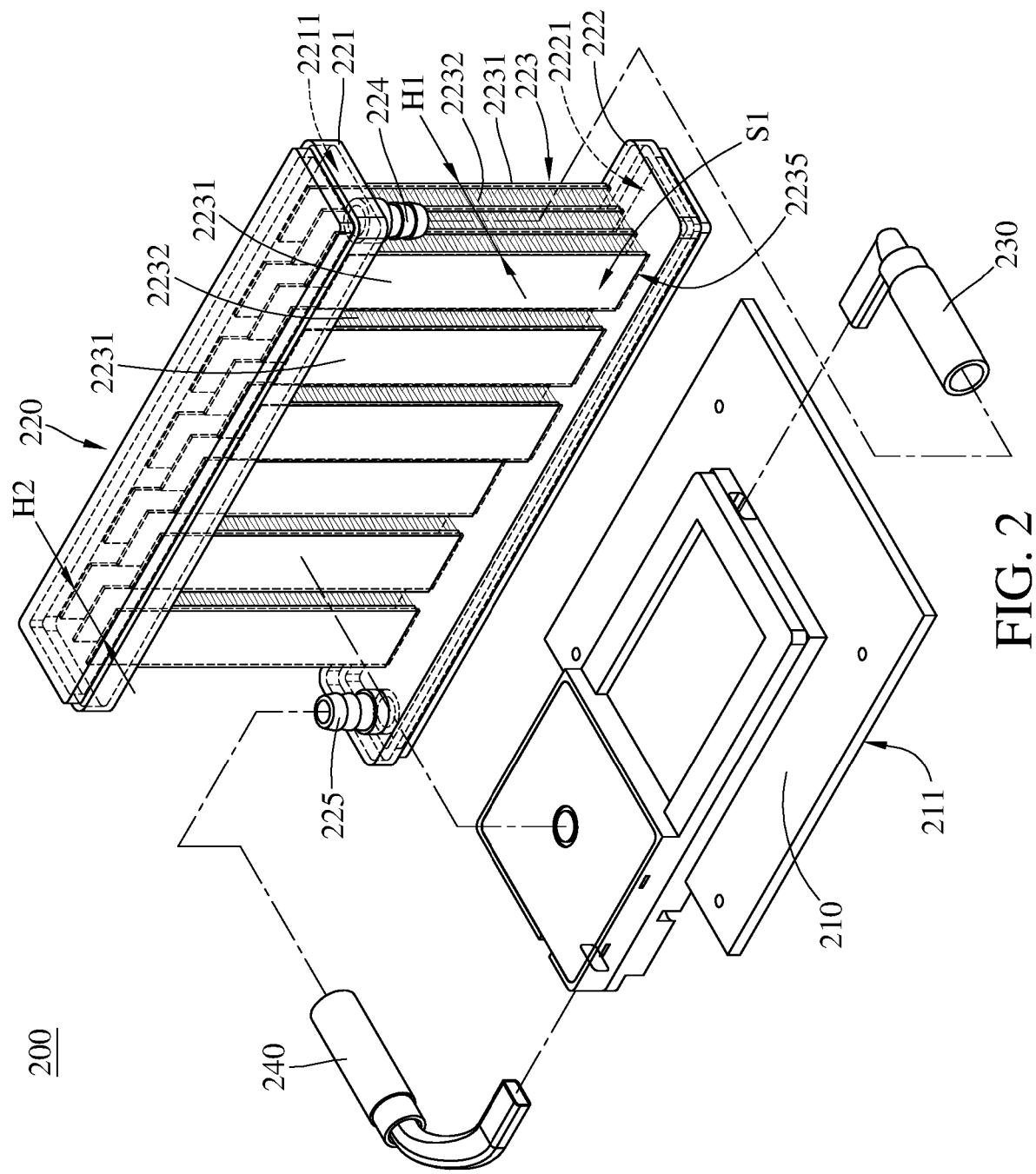
FIG. 2 is an exploded view of a liquid-cooling device of the expansion card assembly in FIG. 1.
Figure 3:
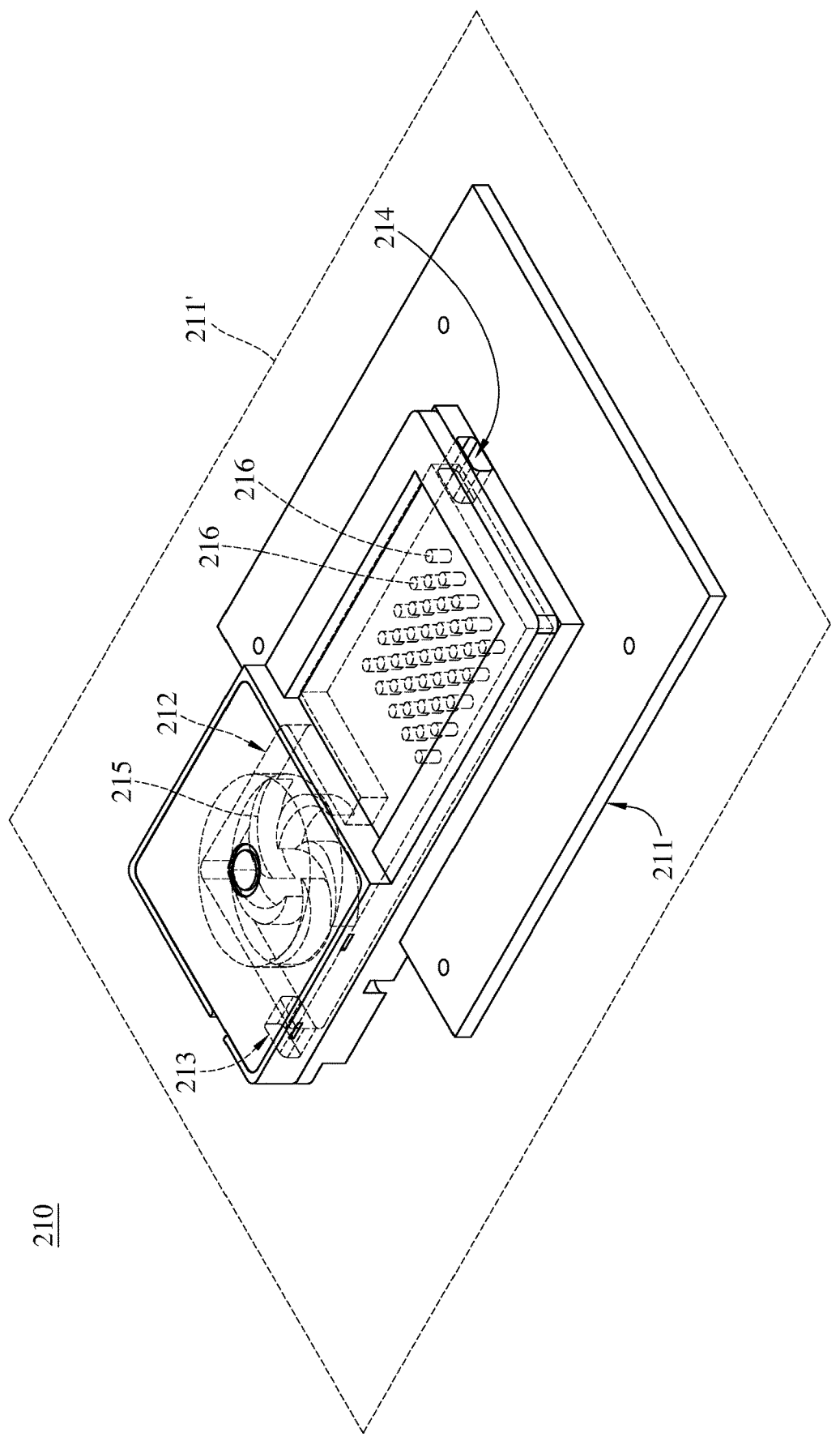
FIG. 3 is a perspective view of a liquid block of the liquid-cooling device in FIG. 2.
Figure 4:
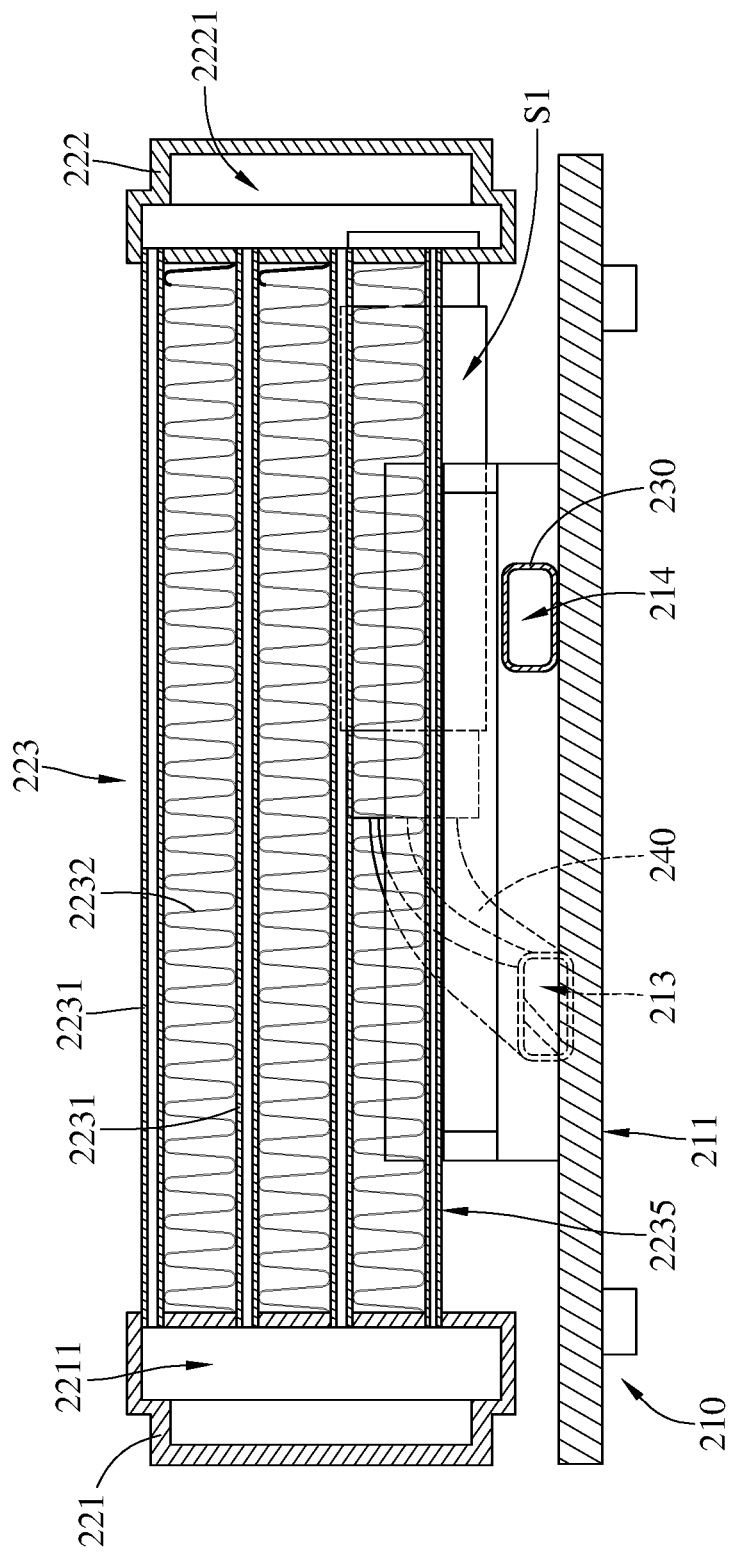
FIG. 4 is a cross-sectional view of the expansion card assembly in FIG. 1.

Please refer to FIG. 1 to FIG. 4, where FIG. 1 is a perspective view of an expansion card assembly according to a first embodiment of the present disclosure, FIG. 2 is an exploded view of a liquid-cooling device of the expansion card assembly in FIG. 1, FIG. 3 is a perspective view of a liquid block of the liquid-cooling device in FIG. 2, and FIG. 4 is a cross-sectional view of the expansion card assembly in FIG. 1.

As shown, one embodiment of the present disclosure provides an expansion card assembly 10. The expansion card assembly 10 may be served as, but is not limited to, a graphics card assembly. The expansion card assembly 10 includes an interface card 100, a liquid-cooling device 200, and an airflow generator 300. The interface card 100 may be a graphics card. The interface card 100 includes a circuit board 110 with a cover plate 120 connected thereto. The cover plate 120 is disposed at a side of the circuit board 110. The circuit board 110 may be fixed to a casing or rack (not shown) through the cover plate 120. The cover plate 120 may have one or more openings (not numbered) for connectors and associated cables (e.g., signal transmission lines, not shown).

The liquid-cooling device 200 includes a liquid block 210 and a radiator 220. The liquid block 210 has a thermal contact surface 211 in thermal contact with a heat source (e.g., a processing unit, not shown) arranged on the interface card 100. The liquid block 210 has an evaporation chamber 212, an inlet 213, and an outlet 214. The inlet 213 and the outlet 214 are in fluid communication with the evaporation chamber 212. The liquid block 210 may further include an impeller 215 located in the evaporation chamber 212. The impeller 215 does not overlap with the thermal contact surface 211 in the axial direction thereof. It can be also considered that a projection of the impeller 215 on an extension surface 211' of the thermal contact surface 211 is at least partially located outside the range of the thermal contact surface 211. The impeller 215 is rotatable to force the cooling liquid in the evaporation chamber 212 to flow towards the outlet 214 from the inlet 213.

The liquid block 210 includes a plurality of posts 216, and the extension direction of each post 216 passes through the thermal contact surface 211. In other words, the posts 216 overlap with the thermal contact surface 211. It can be also considered that projections of the posts 216 on the extension surface 211' of the thermal contact surface 211 are located within the range of the thermal contact surface 211.

The radiator 220 includes a first tank 221, a second tank 222, and a heat dissipation channel structure 223. The first tank 221 has a first chamber 2211. The second tank 222 has a second chamber 2221. The heat dissipation channel structure 223 includes a plurality of liquid transmission components 2231. The first chamber 2211 of the first tank 221 and the second chamber 2221 of the second tank 222 are respectively connected to two opposite sides of the heat dissipation channel structure 223. Each of the liquid transmission components 2231 of the heat dissipation channel structure 223 has an end in fluid communication with the first chamber 2211 of the first tank 221 and another end in fluid communication with the second chamber 2221 of the second tank 222. As shown in FIG. 4, each of the liquid transmission components 2231 has a hollow part therein for achieving the abovementioned fluid communications with the first chamber 2211 and the second chamber 2221, such that the cooling liquid is able to flow through the first chamber 2211, the hollow parts of the liquid transmission components 2231, and the second chamber 2221, sequentially. The first chamber 2211 and the second chamber 2221 are in fluid communication with the evaporation chamber 212 of the liquid block 210 to form a cooling cycle.

In detail, the liquid-cooling device 200 further includes a first tube 230 and a second tube 240. The radiator 220 further includes a first fluid connector 224 and a second fluid connector 225 that are respectively disposed on the first tank 221 and the second tank 222. The first fluid connector 224 is in fluid communication with the outlet 214 of the liquid block 210 via the first tube 230. The second fluid connector 225 is in fluid communication with the inlet 213 of the liquid block 210 via the second tube 240.

In this embodiment, the heat dissipation channel structure 223 further includes a plurality of heat dissipation structures 2232 (e.g., heat dissipation fins). One of the heat dissipation structures 2232 is connected to adjacent two of the liquid transmission components 2231.

In this embodiment, the first tank 221 and the second tank 222 protrude from an edge 2235 of the heat dissipation channel structure 223 located close to the interface card 100. The first tank 221, the second tank 222, and the heat dissipation channel structure 223 together surround an accommodation space S1. The liquid block 210 is at least partially located in the accommodation space S1, and the liquid block 210 has two opposite sides respectively spaced apart from the first tank 221 and the second tank 222.

Note that the protrusions of the first tank 221 and the second tank 222 from the edge 2235 of the heat dissipation channel structure 223 are not intended to limit the present disclosure. In some other embodiments, the first tank and the second tank may be flush with the edge of the heat dissipation channel structure located close to the interface card.

In this embodiment, the circuit board 110 of the interface card 100 has a mount surface 111. An arrangement direction A perpendicular to a normal direction N of the mount surface 111 is defined. The liquid transmission components 2231 are divided into a plurality of groups spaced apart from one another along the arrangement direction A. The liquid transmission components 2231 in each group are arranged along the normal direction N of the mount surface 111 of the interface card 100.

Note that the arrangement and number of the liquid transmission components 2231 are not intended to limit the present disclosure. In some other embodiments, the heat dissipation channel structure may have only one liquid transmission component extending from end to end of the first tank.

In this embodiment, at least two groups of the liquid transmission components 2231 have different thicknesses in the normal direction N of the mount surface 111. In detail, the thickness H1 of one group of the liquid transmission components 2231 is greater than the thickness H2 of another group of the liquid transmission components 2231.

Note that the different thicknesses of the at least two groups of the liquid transmission components 2231 in the normal direction N are not intended to limit the present disclosure. In some other embodiments, the liquid transmission components may have the same thickness in the normal direction of the mount surface, or may have other designed thicknesses based on the shape of the liquid block.

The airflow generator 300 may be a centrifugal fan. The radiator 220 is located between the cover plate 120 of the interface card 100 and the airflow generator 300. The airflow generator is configured to generate a lateral airflow towards the heat dissipation channel structure 223 of the radiator 220 so as to dissipate the heat generated by the interface card 100 out through the openings of the cover plate 120.

In this embodiment, the expansion card assembly 10 may further include a casing 400 installed on the circuit board 110 to enclose the liquid-cooling device 200 and the airflow generator 300. The casing 400 has a vent hole 410 exposing the airflow generator 300 and for the airflow generator 300 to draw ambient air into the casing 400.

According to the expansion card assembly and the liquid-cooling device discussed above, each liquid transmission component of the heat dissipation channel structure has an end in fluid communication with the first chamber of the first tank and another end in fluid communication with the second chamber of the second tank, preventing a mixture of hot and cold liquid from existing in the first chamber and the second chamber. Therefore, the heat dissipation efficiency of the liquid-cooling device can be improved.

Also, two opposite sides of the liquid block are respectively spaced apart from the first tank and the second tank and are indirectly connected to the first tank and the second tank via the first tube and the second tube. This arrangement makes it convenient to manufacture the liquid-cooling device.

The embodiments are chosen and described in order to best explain the principles of the present disclosure and its practical applications, to thereby enable others skilled in the art best utilize the present disclosure and various embodiments with various modifications as are suited to the particular use being contemplated. It is intended that the scope of the present disclosure is defined by the following claims and their equivalents.

What is claimed is:

1. An expansion card assembly, comprising:
   an interface card;
   a liquid-cooling device, comprising:
      a liquid block, in thermal contact with the interface card; and
      a radiator, comprising:
         a first tank,
         a second tank, and
         a heat dissipation channel structure,
         wherein the first tank has a first chamber, the second tank has a second chamber, the heat dissipation channel structure comprises a plurality of liquid transmission components, the first chamber of the first tank and the second chamber of the second tank are respectively connected to two opposite sides of the heat dissipation channel structure, each of the plurality of liquid transmission components of the heat dissipation channel structure has an end in fluid communication with the first chamber of the first tank and another end in fluid communication with the second chamber of the second tank, each of the plurality of liquid transmission components has a hollow part therein as being in fluid communications with the first chamber and the second chamber, the first chamber and the second chamber are in fluid communication with the liquid block to form a cooling cycle, the first tank and the second tank protrude from an edge of the heat dissipation channel structure located close to the interface card, the first tank, the second tank, and the heat dissipation channel structure together surround an accommodation space, the liquid block is at least partially located in the accommodation space, and the liquid block has two opposite sides respectively spaced apart from the first tank and the second tank; and
   an airflow generator, located adjacent to the radiator, wherein the airflow generator is configured to generate an airflow flowing towards the heat dissipation channel structure of the radiator.

2. The expansion card assembly according to claim 1, wherein the interface card has a mount surface, an arrangement direction perpendicular to a normal direction of the mount surface is defined, the plurality of liquid transmission components are divided into a plurality of groups, the plurality of liquid transmission components in each group are arranged along the normal direction of the mount surface of the interface card, and each group of the plurality of liquid transmission components is spaced apart from one another along the arrangement direction.

3. The expansion card assembly according to claim 2, wherein at least two groups of the plurality of liquid transmission components have different thicknesses in the normal direction of the mount surface.

4. The expansion card assembly according to claim 2, wherein the heat dissipation channel structure further comprises a plurality of heat dissipation structures, and one of the plurality of heat dissipation structures is connected to adjacent two of the plurality of liquid transmission components.

5. The expansion card assembly according to claim 1, wherein the liquid-cooling device further comprises:
   a first tube and
   a second tube,
   the liquid block comprises:
      an evaporation chamber,
      an inlet, and
      an outlet,
      wherein the inlet and the outlet are in fluid communication with the evaporation chamber, the radiator further comprises a first fluid connector and a second fluid connector that are respectively disposed on the first tank and the second tank, the first fluid connector is in fluid communication with the outlet of the liquid block via the first tube, and the second fluid connector is in fluid communication with the inlet of the liquid block via the second tube.

6. The expansion card assembly according to claim 1, wherein the liquid block has a thermal contact surface which is configured to be in thermal contact with the interface card, the liquid block comprises an impeller, and a projection of the impeller on an extension surface of the thermal contact surface is at least partially located outside a range of the thermal contact surface.

7. The expansion card assembly according to claim 6, wherein the liquid block comprises a plurality of posts, and projections of the plurality of posts on the extension surface of the thermal contact surface are located within the range of the thermal contact surface.

8. The expansion card assembly according to claim 1, wherein the interface card comprises a circuit board and a cover plate, the cover plate is disposed at a side of the circuit board, and the radiator is located between the cover plate and the airflow generator.

9. The expansion card assembly according to claim 8, wherein the airflow generator is a centrifugal fan.

10. A liquid-cooling device, configured to be in thermal contact with an interface card, comprising:
    a liquid block, configured to be in thermal contact with the interface card; and
    a radiator, comprising:
       a first tank,
       a second tank, and
       a heat dissipation channel structure,
       wherein the first tank has a first chamber, the second tank has a second chamber, the heat dissipation channel structure comprises a plurality of liquid transmission components, the first chamber of the first tank and the second chamber of the second tank are respectively connected to two opposite sides of the heat dissipation channel structure, each of the plurality of liquid transmission components of the heat dissipation channel structure has an end in fluid communication with the first chamber of the first tank and another end in fluid communication with the second chamber of the second tank, each of the plurality of liquid transmission components has a hollow part therein as being in fluid communications with the first chamber and the second chamber, the first chamber and the second chamber are in fluid communication with the liquid block to form a cooling cycle, the first tank and the second tank protrude from an edge of the heat dissipation channel structure located close to the interface card, the first tank, the second tank, and the heat dissipation channel structure together surround an accommodation space, the liquid block is at least partially located in the accommodation space, and the liquid block has two opposite sides respectively spaced apart from the first tank and the second tank.

11. The liquid-cooling device according to claim 10, wherein the interface card has a mount surface, an arrangement direction perpendicular to a normal direction of the mount surface is defined, the plurality of liquid transmission components are divided into a plurality of groups, the plurality of liquid transmission components in each group are arranged along the normal direction of the mount surface of the interface card, and each group of the plurality of liquid transmission components is spaced apart from one another along the arrangement direction.

12. The liquid-cooling device according to claim 11, wherein at least two groups of the plurality of liquid transmission components have different thicknesses in the normal direction of the mount surface.

13. The liquid-cooling device according to claim 11, wherein the heat dissipation channel structure further comprises a plurality of heat dissipation structures, and one of the plurality of heat dissipation structures is connected to adjacent two of the plurality of liquid transmission components.

14. The liquid-cooling device according to claim 10, further comprising:
 a first tube and
 a second tube,
wherein the liquid block comprises:
 an evaporation chamber,
 an inlet, and
 an outlet,
 wherein the inlet and the outlet are in fluid communication with the evaporation chamber, the radiator further comprises a first fluid connector and a second fluid connector that are respectively disposed on the first tank and the second tank, the first fluid connector is in fluid communication with the outlet of the liquid block via the first tube, and the second fluid connector is in fluid communication with the inlet of the liquid block via the second tube.

15. The liquid-cooling device according to claim 10, wherein the liquid block has a thermal contact surface which is configured to be in thermal contact with the interface card, the liquid block comprises an impeller, and a projection of the impeller on an extension surface of the thermal contact surface is at least partially located outside a range of the thermal contact surface.

16. The liquid-cooling device according to claim 15, wherein the liquid block comprises a plurality of posts, and projections of the plurality of posts on the extension surface of the thermal contact surface are located within the range of the thermal contact surface.

* * * * *